(12) United States Patent
Toguchi et al.

(10) Patent No.: US 6,180,267 B1
(45) Date of Patent: Jan. 30, 2001

(54) ORGANIC ELECTROLUMINESCENT DEVICE CONTAINING A 1,3-DIBENZYLIDENEINDANE COMPOUND

(75) Inventors: Satoru Toguchi; Atsushi Oda; Hitoshi Ishikawa, all of Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/226,667

(22) Filed: Jan. 8, 1999

(51) Int. Cl.$^7$ .................................................. H05B 33/12
(52) U.S. Cl. ........................ 428/690; 428/917; 313/504; 313/506
(58) Field of Search .................................. 428/690, 917; 313/504, 506

(56) References Cited

U.S. PATENT DOCUMENTS 5,077,142 * 12/1991 Sakon et al. .......................... 428/690

FOREIGN PATENT DOCUMENTS

| 7-138561 | 5/1995 | (JP) . |
| 8-20770 | 1/1996 | (JP) . |
| 8-20771 | 1/1996 | (JP) . |
| 8-40995 | 2/1996 | (JP) . |
| 8-40997 | 2/1996 | (JP) . |
| 8-53397 | 2/1996 | (JP) . |
| 8-87122 | 4/1996 | (JP) . |
| 8-239655 | 9/1996 | (JP) . |

* cited by examiner

Primary Examiner—Marie Yamnitzky

(74) Attorney, Agent, or Firm—Hutchins, Wheeler & Dittmar

(57) ABSTRACT

An organic EL device which comprises an anode, a cathode and one or more than one organic thin-film layer including a light-emitting layer contains a compound represented by the following formula (1):

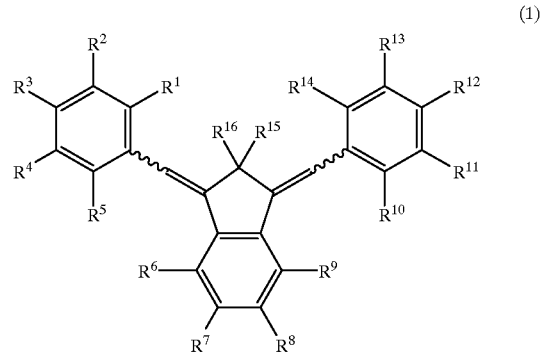

wherein $R^1$ to $R^{16}$ each independently represents a hydrogen atom, a halogen atom, a nitro group, a cyano group, a carboxyl group, a substituted or unsubstituted alkyl group, a substituted or unsubstituted alkenyl group, a substituted or unsubstituted aromatic hydrocarbon group, a substituted or unsubstituted aromatic heterocyclic group, a substituted or unsubstituted amino group, a substituted or unsubstituted alkoxy group, a substituted or unsubstituted aryloxy group or a substituted or unsubstituted alkoxycarbonyl group; and any two of $R^1$ to $R^{14}$ may form a ring. According to the present invention, an organic electroluminescent device having high brightness can be provided.

9 Claims, 2 Drawing Sheets

ORGANIC ELECTROLUMINESCENT DEVICE CONTAINING A 1,3-DIBENZYLIDENEINDANE COMPOUND

BACKGROUND OF THE INVENTION

1. Field of the Invention

This invention relates to an organic electroluminescent device having excellent light-emitting properties.

2. Description of the Related Art

An organic electroluminescent device (which will hereinafter be called "organic EL device" ) is a light-emitting device which makes use of the principle that when an electric field is applied, a fluorescent material emits light in response to the charge recombination of holes injected from an anode and electrons injected from a cathode. After C. W. Tang et al. of Eastman Kodak Company reported a low-voltage-driven organic EL device using a double layered structure (C. W. Tang, S. A. Vanslyke, Applied Physics Letters, 51, 913(1987) and the like), studies on an organic EL device have been briskly carried out. Tang et al. reported an organic EL device using tris(8-hydroxyquinolinol aluminum) in a light-emitting layer and a triphenyldiamine derivative to a hole-transporting layer. This stacked structure gives such advantages as an improvement in the injection efficiency of holes into the light-emitting layer; blocking of electrons injected from a cathode, which increase the efficiency of exciton production from charge recombination; and confinement of the excitons into the light-emitting layer. A double layered structure composed of a hole-injecting and transporting layer and an electron-transporting and light-emitting layer or a triple layered structure composed of a hole-injecting and transporting layer, a light-emitting layer and an electron-injecting and transporting layer is well known as an organic EL device. In order to increase the recombination efficiency of injected holes and electrons, various improvements in the device structure or fabrication process have been introduced to such multi-layered devices. As a hole-transporting material, triphenylamine derivatives such as 4,4',4"-tris(3-methylphenylphenylamino) triphenylamine and aromatic diamine derivatives such as N,N'-diphenyl-N,N' bis(3-methylphenyl)-[1,1'-biphenyl]-4, 4'-diamine, which are starburst molecules, are well known (e.g., Japanese Patent Application Laid-Open Nos. 20771/1996, 40995/1996, 40997/1996, 53397/1996 and 87122/1996).

As an electron-transporting material, oxadiazole derivatives, triazole derivatives and the like are well known. As a light-emitting material, known are chelate complexes such as tris(8-quinolinolate)aluminum complex, coumarin derivatives, tetraphenylbutadiene derivatives, bisstyrylarylene derivatives, oxadiazole derivatives and the like. Since various color light in a visible region from blue to red are obtained from these light-emitting materials, there increased expectation for industrialization of a full color organic EL device (e.g., Japanese Patent Application Laid-Open Nos. 239655/1996, 138561/1995, 200289/1991 and the like). In recent days, organic EL devices with high brightness and long lifetime have been disclosed or reported, but any of them are not enough in these properties.

SUMMARY OF THE INVENTION

An object of the present invention is to provide a material of high performance and to provide an organic EL device having high luminance. The present inventors have repeated experiments. As a result, they have found that an organic EL device having superior emission properties is obtained by using a specific 1,3-dibenzylideneindane compound as a light-emitting material. They have found that said 1,3-dibenzylideneindane compound has high carrier transporting properties and an organic EL device having superior emission properties is obtained by using said 1,3-dibenzylideneindane compound as a hole-transporting material or electron-transporting material. They have found that an organic EL device having superior emission properties is obtained by using a mixture of said 1,3-dibenzylideneindane compound and another hole or electron-transporting material. In the present invention, there is thus provided an organic electroluminescent device comprising an anode, a cathode and one or more than one organic thin-film layers including a light-emitting layer between said anode and said cathode, wherein at least one of said organic thin-film layers contains, either singly or as a mixture, a compound represented by the following formula (1):

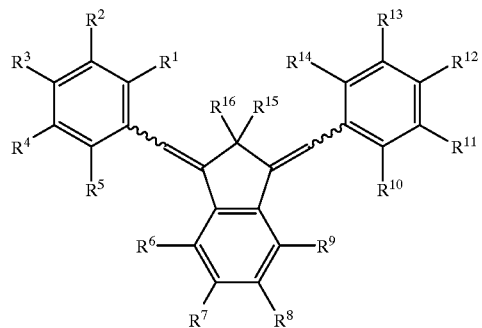

wherein $R^1$ to $R^{16}$ each independently represents a hydrogen atom, a halogen atom, a nitro group, a cyano group, a substituted or unsubstituted alkyl group, a substituted or unsubstituted alkenyl group, a substituted or unsubstituted aromatic hydrocarbon group, a substituted or unsubstituted aromatic heterocyclic group, a substituted or unsubstituted amino group, a substituted or unsubstituted alkoxy group, a substituted or unsubstituted aryloxy group, a substituted or unsubstituted alkoxycarbonyl group or a carboxyl group; and any two of $R^1$ to $R^{14}$ may form a ring.

The organic EL device according to the present invention which contains a compound of formula (1) in an organic thin-film layer emits light with higher brightness compared with the conventional organic EL device.

DETAILED DESCRIPTION OF THE PREFERRED EMBODIMENTS

Figure 1:
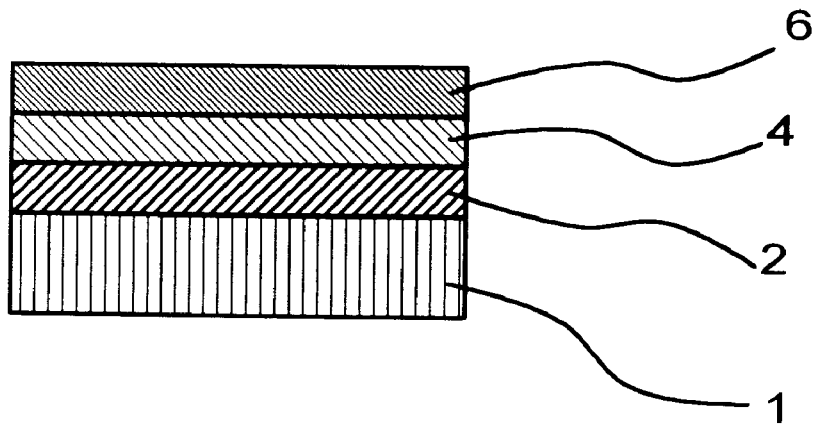
FIG. 1 is a schematic cross-sectional view of an organic EL device of the present invention composed of three layers, that is, anode, light-emitting layer and cathode.

The present invention will hereinafter be described specifically.

The 1,3-dibenzylideneindane compound to be used for the organic EL device of the present invention is a compound having a structure represented by formula (1). In formula (1), $R^1$ to $R^{16}$ each independently represents a hydrogen atom, a halogen atom, a nitro group, a cyano group, a substituted or unsubstituted alkyl group, a substituted or unsubstituted alkenyl group, a substituted or unsubstituted aromatic hydrocarbon group, a substituted or unsubstituted aromatic heterocyclic group, a substituted or unsubstituted amino group, a substituted or unsubstituted alkoxy group, a substituted or unsubstituted aryloxy group, a substituted or unsubstituted alkoxycarbonyl group or a carboxyl group; and any two of $R^1$ to $R^{14}$ may form a ring.

Examples of the halogen atom include fluorine, chlorine, bromine and iodine.

Examples of the alkyl group include linear, branched or cyclic $C_{1-6}$ alkyl groups such as methyl, ethyl, propyl, isopropyl, n-butyl, sec-butyl, isobutyl, n-hexyl and cyclohexyl group. Examples of the alkenyl group include $C_{2-4}$ alkenyl groups such as vinyl, allyl, butenyl and butanedienyl group.

Examples of the aromatic hydrocarbon group include aromatic $C_{6-8}$ hydrocarbon groups such as phenyl, biphenyl, naphthyl, anthryl, terphenyl and pyrenyl group.

Examples of the aromatic heterocyclic group include pyrrolyl, pyrazinyl, furyl, quinolyl and isoquinolyl group. Example of the alkoxy group include linear, branched or cyclic $C_{1-6}$ alkoxy groups such as methoxy, ethoxy, propoxy, isopropoxy, n-butoxy, sec-butoxy, isobutoxy, n-hexyloxy and cyclohexyloxy group.

Examples of the aryloxy group include $C_{6-14}$ aryloxy groups such as phenoxy, naphthoxy and anthryloxy group.

Examples of the alkoxycarbonyl group include $C_{2-4}$ alkoxycarbonyl groups such as methoxycarbonyl, ethoxycarbonyl and isopropoxycarbonyl group.

The above-exemplified groups may have one or more substituents and examples of such a substituent include said halogen atoms, amino group, hydroxyl group, cyano group, nitro group, said $C_{1-6}$ alkyl groups, said $C_{1-6}$ alkoxy groups, $C_{7-13}$ aralkyl groups such as benzyl, diphenylmethyl and phenetyl group, said $C_{6-18}$ aryloxy groups and $C_{1-6}$ acyl groups such as formyl, acetyl, propionyl, butyryl, valeryl and benzoyl group. Examples of the substituted amino group include amino groups having one or two substituents such as said alkyl group, said aralkyl group, said acyl group or said $C_{6-18}$ aryl group. When it has two substituents, they may be the same or different. The compound of formula (1) to be used in the present invention can be obtained, for example, by reacting a 1,3-indanedione derivative represented by the following formula (2):

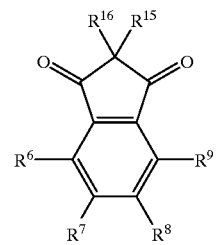

(2)

wherein $R^6$ to $R^9$, $R^{15}$ and $R^{16}$ have the same meanings as described above, with one or two benzyldiethyl phosphonate (s) represented by the following formula (3):

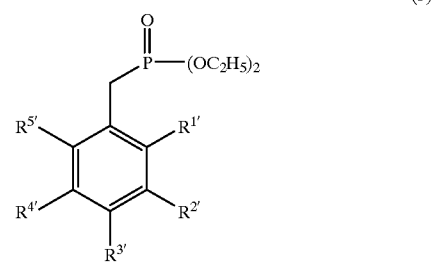

(3)

wherein $R^{1'}$, $R^{2'}$, $R^{3'}$, $R^{4'}$ and $R^{5'}$ have the same meanings as $R^1$, $R^2$, $R^3$, $R^4$ and $R^5$ or $R^{10}$, $R^{11}$, $R^{12}$, $R^{13}$ and $R^{14}$ respectively in formula (1).

Examples of the compounds represented by formula (1) to be used in the organic EL device of the present invention are shown below, but it should be borne in mind that the present invention is not limited by them. In the above and below-described structural formulas, the bond indicated by a wavy line may exist either in the cis side or trans side of the benzene ring in the central indane skeleton.

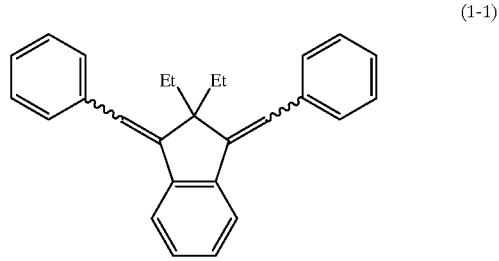

(1-1)

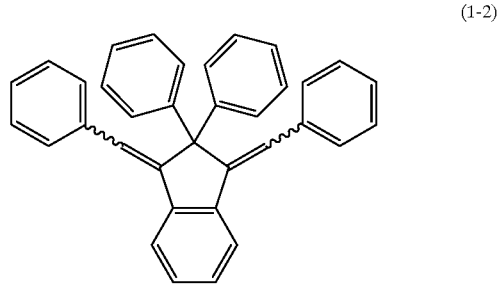

(1-2)

-continued

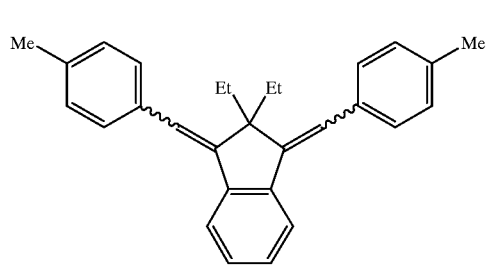
(1-3)

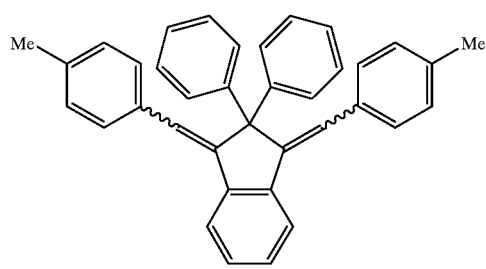
(1-4)

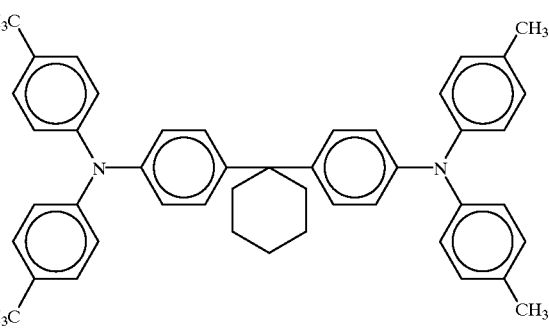
(A)

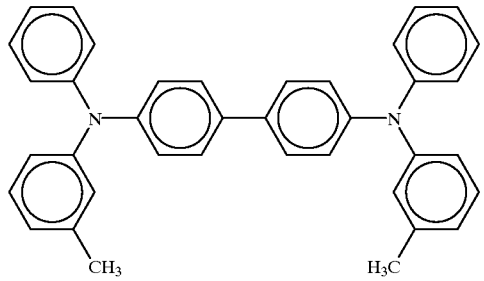
(B)

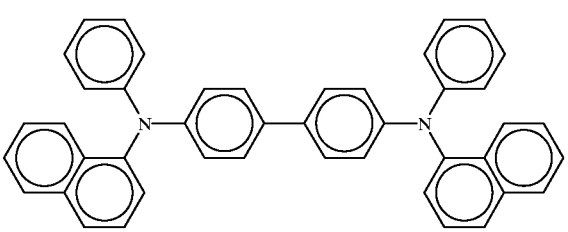
(C)

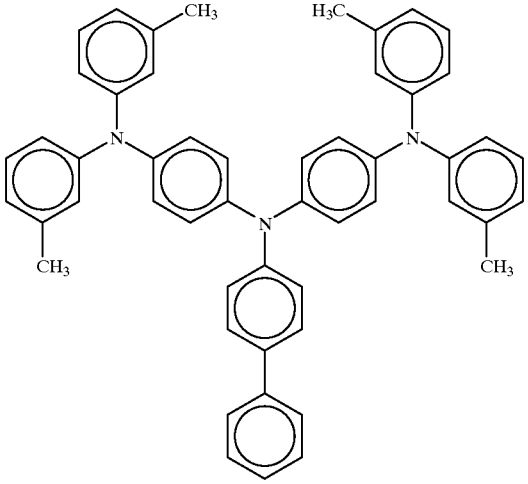
(D)

Figure 2:
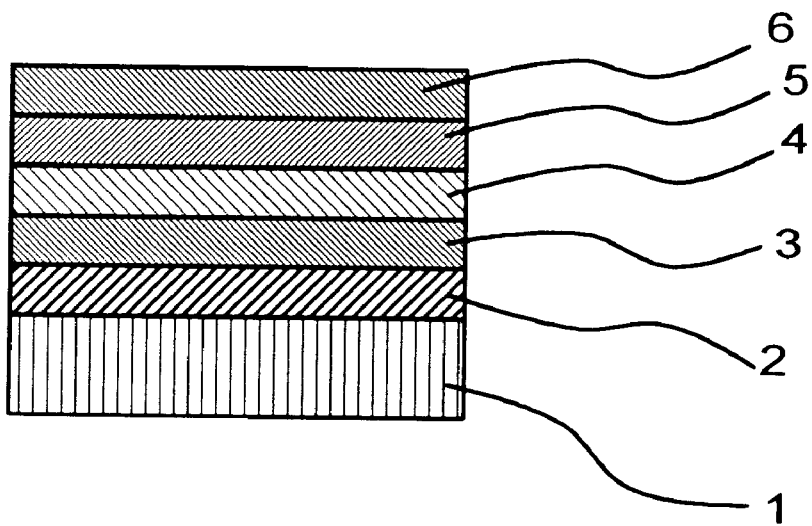
FIG. 2 is a schematic cross-sectional view of an organic EL device of the present invention composed of five layers, that is, anode, hole-transporting layer, light-emitting layer, electron-transporting layer and cathode.
Figure 3:
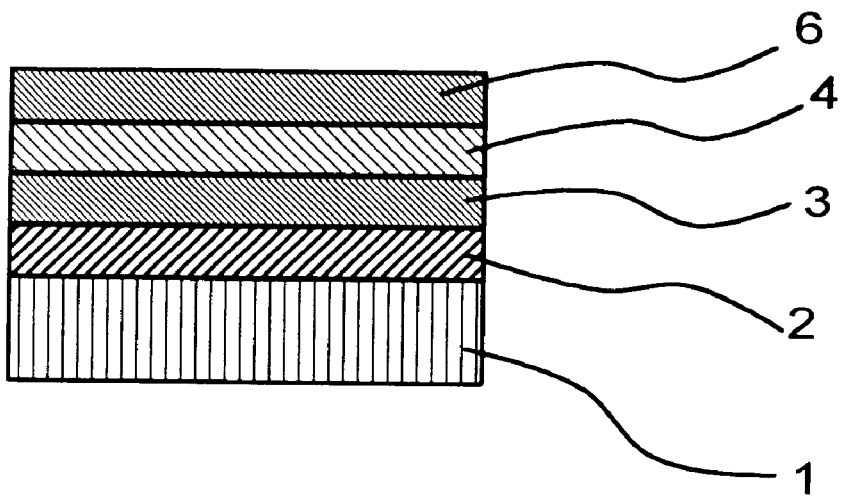
FIG. 3 is a schematic cross-sectional view of an organic EL device of the present invention composed of four layers, that is, anode, hole-transporting layer, light-emitting layer and cathode.
Figure 4:
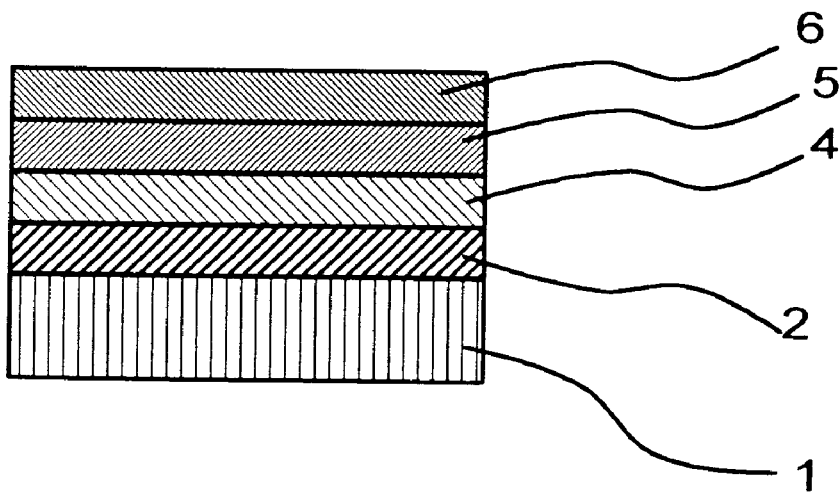
FIG. 4 is a schematic cross-sectional view of an organic EL device of the present invention composed of four layers, that is, anode, light-emitting layer, electron-transporting layer and cathode.

The organic EL device according to the present invention has a multi-layered structure having one or more than one organic thin-film layers including a light-emitting layer formed between electrodes. Examples include the structure as shown in FIG. 1 wherein an anode 2, light-emitting layer 4 and cathode 6 have been stacked one after another on a substrate 1; the structure as shown in FIG. 2 wherein an anode 2, hole-transporting layer 3, light-emitting layer 4, electron-transporting layer 5 and cathode 6 have been stacked one after another on a substrate 1; the structure as shown in FIG. 3 wherein an anode 2, hole-transporting layer 3, light-emitting layer 4 and cathode 6 have been stacked one after another on a substrate 1; and the structure as shown in FIG. 4 wherein an anode 2, hole-transporting layer 3, light-emitting layer 4, electron-transporting layer 5 and cathode 6 have been stacked one after another on a substrate 1. The compound of formula (1) in the present invention may be used in any one of the above-described organic layers such as hole-transporting layer 3, light-emitting layer 4 or electron-transporting layer 5. A mixture of the compound and another hole-transporting material, light-emitting material or electron-transporting material can be also used. In the present invention, the substrate 1 is not indispensable. When strength of the device is sufficient without the substrate, it is not necessary.

There is no particular limitation imposed on the hole-transporting material usable in the present invention. Any compound employed as an ordinary hole-transporting material may be used. Examples include bis-triarylamines such as bis[di(p-tolyl)aminophenyl]-1,1-cyclohexane represented by the below-described formula (A), N,N'-diphenyl-N,N'-bis( 3-methylphenyl)-[1,1'-biphenyl]-4,4'-diamine represented by the below-described formula (B) and N,N'-diphenyl-N-N-bis(1-naphthyl)-[1,1'-biphenyl]-4,4'-diamine represented by the below-described formula (C) and compounds having starburst type structure represented by the below-described formulas (D) to (F):

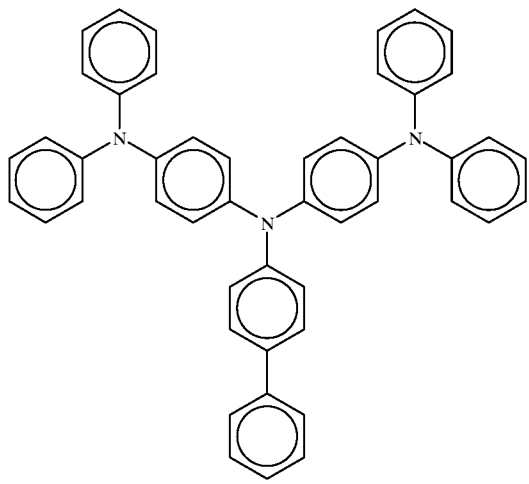 (E)

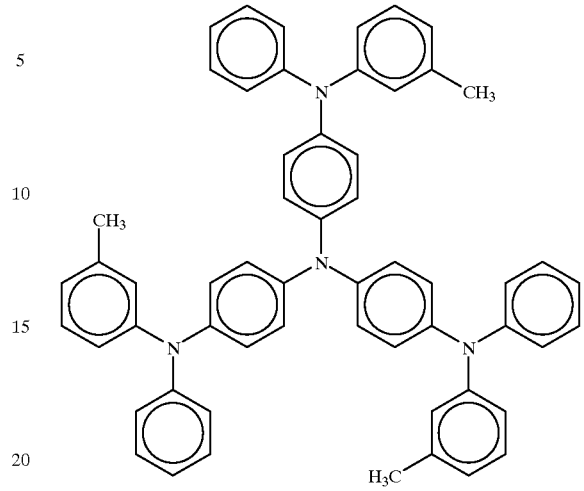 (F)

There is no particular limitation imposed on the electron-transporting material usable in the present invention. Any material employed ordinarily as an electron-transporting material can be employed. Examples include oxadiazole derivatives such as 2-(4-biphenylyl)-5-(4-t-butylphenyl)-1,3,4-oxadiazole represented by the below-described formula (G) and bis{2-(4-t-butylphenyl)-1,3,4-oxadiazole}-m-phenylene represented by the below-described formula (H), triazole derivatives represented by the below-described formulas (I) and (J) and metal complex compounds of quinolinol derivatives represented by the below-described formulas (K) to (N):

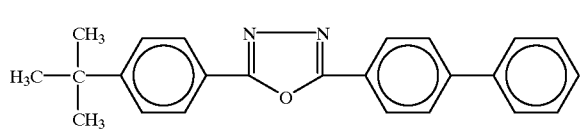 (G)

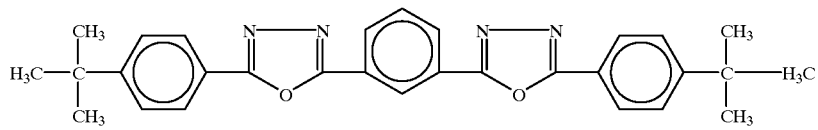 (H)

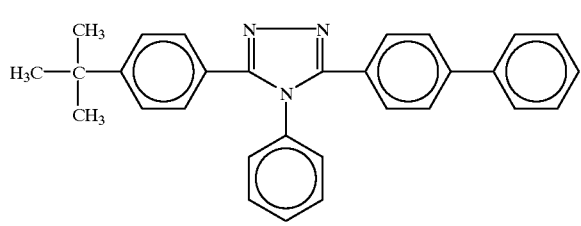 (I)

(J)

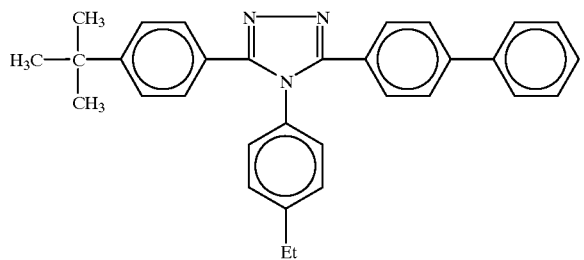

(K)

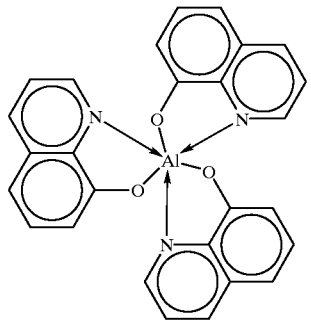

(L)

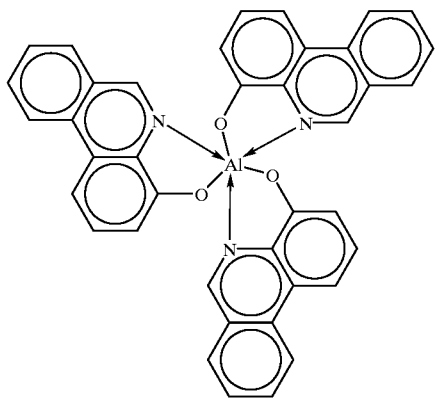

(M)

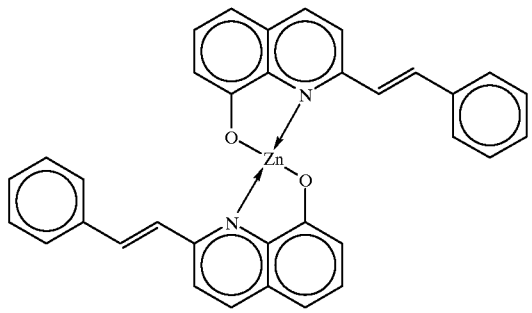

(N)

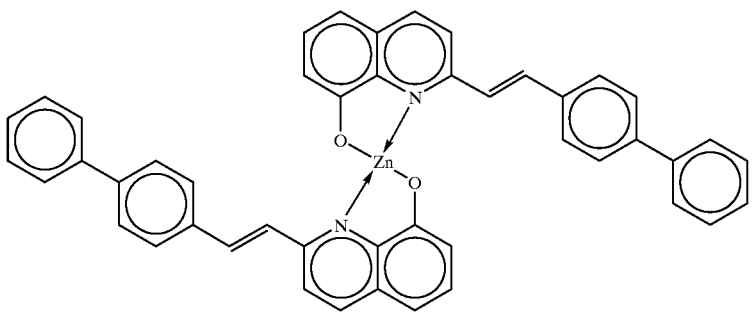

The anode of the organic EL device injects holes into the hole-transporting layer and that having a work function of 4.5 eV or greater is effective. Specific examples of the anode material to be used for the organic EL device of the present invention include an indium tin oxide (ITO), tin oxide (NESA), gold, silver, platinum and copper.

For the injection of electrons into the electron-transporting layer or light-emitting layer, the cathode of the organic EL device having a smaller work function is preferred. Although there is no particular limitation imposed on the cathode material, specific examples include indium, aluminum, magnesium, magnesium-indium alloy, magnesium-aluminum alloy, aluminum-lithium alloy, aluminum-scandium-lithium alloy and magnesium-silver alloy. The anode thickness is ordinarily within a range of 10 nm to 1 μm, preferably 10 nm to 200 nm. The cathode thickness is ordinarily within a range of 10 nm to 1 μm, preferably 50 nm to 200 nm. In the organic EL device of the present invention, either one of the anode or cathode is preferred to be transparent or semi-transparent, because such a cathode or anode can pass through an emitted light. No particular limitation is imposed on the material of the substrate. Any material that is ordinarily used as a substrate for the conventional EL device, such as glass, transparent plastics and quartz, can be used. There is no limitation on the thickness of the substrate. Each layer of the organic EL device according to the present invention can be fabricated by any method. Conventionally known methods such as vacuum deposition and spin coating can be employed. The organic thin-film layer which is to be used in the organic EL device of the present invention and contains the compound of formula (1) can be fabricated by a known method such as vacuum deposition, molecular beam epitaxy (MBE) or coating of a solution, which has been obtained by dissolving the compound or a mixture of the compound in a proper solvent, such as dipping, spin coating, casting, bar coating or roll coating. There is no particular limitation on the thickness of each organic layer of the organic EL device of the present invention. When the thickness of layer is too thin, defects such as pin holes tend to occur. When the thickness of layer is too thick, on the other hand, a high-applied voltage is required, which decreases the efficiency. Usually, the organic layers are therefore preferred to have a thickness within a range of several nm to 1 µm.

The present invention will hereinafter be described in detail with reference to examples, but it should however be borne in mind that the present invention is not limited only to the following examples unless the spirit or scope of the invention is changed.

SYNTHESIS EXAMPLE 1

Synthesis of Compound (1-1) (2,2-diethyl-1,3-dibenzylideneindane)

With 2,2-diethyl-1,3-indanedione, 2 equivalents of benzyldiethyl phosphonate were reacted at room temperature for 8 hours together with sodium hydride in dimethylsulfoxide in accordance with the known Wittig-Horner method, whereby the target 2,2-diethyl-1,3-dibenzylideneindane was obtained.

SYNTHESIS EXAMPLE 2

Synthesis of Compound (1-2) (2,2-diphenyl-1,3-dibenzylideneindane)

In a similar manner to Synthesis Example 1 except for the use of 2,2-diphenyl-1,3-indanedione instead of 2,2-diethyl-1,3-indanedione, the target 2,2-diphenyl-1,3-dibenzylideneindane was obtained.

SYNTHESIS EXAMPLE 3

Synthesis of Compound (1-3) (2,2-diethyl-1,3-di(p-methylbenzylidene)indane)

In a similar manner to Synthesis Example 1 except for the use of p-methylbenzyldiethyl phosphonate instead of benzyldiethyl phosphonate, the target 2,2-diethyl-1,3-di(p-methylbenzylidene)indane was obtained.

SYNTHESIS EXAMPLE 4

Synthesis of Compound (1-4) (2,2-diphenyl-1,3-di(p-methylbenzylidene)indane)

In a similar manner to Synthesis Example 3 except for the use of 2,2-diphenyl-1,3-indanedione instead of 2,2-diethyl-1,3-indanedione, the target 2,2-diphenyl-1,3-di(p-methylbenzylidene)indane was obtained.

A description will next be made of the following examples wherein the compound of formula (1) according to the present invention is used in a light-emitting layer (Examples 1 to 10), a mixture of the compound of formula (1) and a hole-transporting material is used in a light-emitting layer (Examples 11 to 13), a mixture of the compound of formula (1) and an electron-transporting material is used as a light-emitting layer (Examples 14 to 16), the invention compound is used in a hole-transporting layer (Examples 17 to 21) and the compound of formula (1) is used in an electron-transporting layer (Examples 21 to 24).

EXAMPLE 1

An organic EL device composed of three layers, that is, an anode, a light-emitting layer and a cathode as illustrated in the schematic cross-sectional view of FIG. 1 was fabricated. First, ITO was sputtered on glass substrate 1 to form a 120 nm thick film having a sheet resistance of 20 Ω/□ as anode 2. Over the anode, a 40 nm thick light-emitting layer 4 was formed by the vacuum deposition of Compound (1-1) synthesized in Synthesis Example 1. Then, a 200 nm thick cathode 6 was formed by the vacuum deposition of a magnesium-silver alloy, whereby the organic EL device was fabricated. When a dc voltage of 5 V was applied to the resulting device, blue light emission of 100 cd/m² was obtained.

EXAMPLE 2

In a similar manner to Example 1 except for the use of Compound (1-2) instead of Compound (1-1), an organic EL device was fabricated. When a dc voltage of 5V was applied to the resulting device, blue light emission of 130 cd/m² was obtained.

EXAMPLE 3

In a similar manner to Example 1 except for the use of Compound (1-3) instead of Compound (1-1), an organic EL device was fabricated. When a dc voltage of 5 V was applied to the resulting device, blue light emission of 120 cd/m² was obtained.

EXAMPLE 4

In a similar manner to Example 1 except for the use of Compound (1-4) instead of Compound (1-1), an organic EL device was fabricated. When a dc voltage of 5 V was applied to the resulting device, blue light emission of 130 cd/m² was obtained.

EXAMPLE 5

In a similar manner to Example 2 except that a 40 nm thick light-emitting layer was formed by the spin coating of a chloroform solution of Compound (1-2) instead of the vacuum deposition method, an organic EL device was fabricated. When a dc voltage of 5 V was applied to the resulting device, blue light emission of 120 cd/m² was obtained.

EXAMPLE 6

An organic EL device composed of 5 layers, that is, an anode, a hole-transporting layer, a light-emitting layer, an electron-transporting layer and a cathode as illustrated in the schematic cross-sectional view of FIG. 2 was fabricated. First, ITO was sputtered on glass substrate 1 to form a 120 nm thick film having a sheet resistance of 20 Ω/□ as anode 2. Over the anode, a 50 nm thick hole-transporting layer 3 was formed by the vacuum deposition of the compound of formula (B). Then, a 40 nm thick light-emitting layer 4 was formed by the vacuum deposition of Compound (1-1). A 50 nm thick electron-transporting layer 5 was formed by the vacuum deposition of the compound of formula (G). Finally, a 200 nm thick cathode 6 was formed by the vacuum deposition of a magnesium-silver alloy, whereby the organic EL device of the present invention was fabricated. When a dc voltage of 10 V was applied to the resulting device, blue light emission of 1000 cd/m² was obtained.

EXAMPLE 7

In a similar manner to Example 6 except for the use of Compound (1-2) instead of Compound (1-1), an organic EL device was fabricated. When a dc voltage of 10 V was applied to the resulting device, blue light emission of 1100 cd/m² was obtained.

EXAMPLE 8

In a similar manner to Example 6 except for the use of the compound of formula (C) instead of the compound of formula (B) in a hole-transporting layer and the compound of formula (H) instead of the compound of formula (G) in an electron-transporting layer, an organic EL device was fabricated. When a dc voltage of 10 V was applied to the resulting device, blue light emission of 1500 cd/m² was obtained.

EXAMPLE 9

In a similar manner to Example 6 except for the use of the compound of formula (D) instead of the compound of formula (B) in a hole-transporting layer and the compound of formula (I) instead of the compound of formula (G) in an electron-transporting layer, an organic EL device was fabricated. When a dc voltage of 10 V was applied to the resulting device, blue light emission of 2000 cd/m² was obtained.

EXAMPLE 10

In a similar manner to Example 6 except for the use of the compound of formula (E) instead of the compound of formula (B) in a hole-transporting layer and the compound of formula (J) instead of the compound of formula (G) in an electron-transporting layer, an organic EL device was fabricated. When a dc voltage of 10 v was applied to the resulting device, blue light emission of 2300 cd/m² was obtained.

EXAMPLE 11

An organic EL device composed of 4 layers, that is, an anode, a light-emitting layer, an electron-transporting layer and a cathode as illustrated in the schematic cross-sectional view of FIG. 4 was fabricated. First, ITO was sputtered on glass substrate 1 to form a 120 nm thick film having a sheet resistance of 20 Ω/□ as the anode 2. Over the anode, a 50 nm thick light-emitting layer 4 was formed by the vacuum co-deposition of the compound of formula (C) and Compound (1-1) at a weight ratio of 1:10. A 50 nm thick electron-transporting layer 5 was formed by the vacuum deposition of the compound of formula (I). Finally, a 200 nm thick cathode 6 was formed by the vacuum deposition of a magnesium-silver alloy, whereby the organic EL device of the present invention was fabricated. When a dc voltage of 10 V was applied to the resulting device, blue light emission of 1200 cd/m² was obtained.

EXAMPLE 12

In a similar manner to Example 11 except for the use of Compound (1-2) instead of Compound (1-1), an organic EL device was fabricated,. When a dc voltage of 10 V was applied to the resulting device, blue light emission of 1300 cd/m² was obtained.

EXAMPLE 13

In a similar manner to Example 11 except that a 40 nm thick light-emitting layer was formed by spin coating of a chloroform solution of a 1:10 (molar ratio) mixture of Compound (1-2) and the compound of formula (C) and a 50 nm thick electron-transporting layer 5 was formed by the vacuum deposition of the compound of formula (J), an organic EL device was fabricated. When a dc voltage of 10 V was applied to the resulting device, blue light emission of 1000 cd/m² was obtained.

EXAMPLE 14

An organic EL device composed of 4 layers, that is, an anode, a hole-transporting layer, a light-emitting layer and a cathode as illustrated in the schematic cross-sectional view of FIG. 3 was fabricated. First, ITO was sputtered on a glass substrate 1 to form a 120 nm thick film having a sheet resistance of 20 Ω/□ as anode 2. Over the anode, a 50 nm thick hole-transporting layer 3 was formed by the vacuum deposition of the compound of formula (C). A 50 nm thick light-emitting layer 4 was then formed by the vacuum co-deposition of the compound of formula (K) and Compound (1-1) at a weight ratio of 20:1. Finally, a 200 nm thick cathode 6 was formed by the vacuum deposition of a magnesium-silver alloy, whereby the organic EL device of the present invention was fabricated. When a dc voltage of 10 V was applied to the resulting device, blue light emission of 1500 cd/m² was obtained.

EXAMPLE 15

In a similar manner to Example 14 except for the use of Compound (1-2) instead of Compound (1-1), an organic EL device was fabricated. When a dc voltage of 10 V was applied to the resulting device, blue light emission of 1800 cd/m² was obtained.

EXAMPLE 16

In a similar manner to Example 14 except for the use of the compound of formula (B) instead of the compound of formula (C) and the compound of formula (M) instead of the compound of formula (K), an organic EL device was fabricated. When a dc voltage of 10 V was applied to the resulting device, blue light emission of 1700 cd/m² was obtained.

EXAMPLE 17

In a similar manner to Example 6 except for the use of Compound (1-1) instead of the compound of formula (B) a hole-transporting layer 3 and the compound of formula (M) instead of Compound (1-1) in a light-emitting layer 4, an organic EL device was fabricated. When a dc voltage of 10 V was applied to the resulting device, blue light emission of 800 cd/m² was obtained.

EXAMPLE 18

In a similar manner to Example 17 except for the use of Compound (1-2) instead of Compound (1-1) in a hole-transporting layer 3, an organic EL device was fabricated. When a dc voltage of 10 V was applied to the resulting device, blue light emission of 730 cd/m² was obtained.

EXAMPLE 19

In a similar manner to Example 17 except for the use of Compound (1-3) instead of Compound (1-1) in a hole-transporting layer 3, an organic EL device was fabricated. When a dc voltage of 10 V was applied to the resulting device, blue light emission of 850 cd/m² was obtained.

EXAMPLE 20

In a similar manner to Example 17 except for the use of Compound (1-4) instead of Compound (1-4) in a hole-transporting layer 3, an organic EL device was fabricated. When a dc voltage of 10 V was applied to the resulting device, blue light emission of 800 cd/m² was obtained.

EXAMPLE 21

In a similar manner to Example 6 except for the use of the compound of formula (C) instead of the compound of formula (B) in a hole-transport layer 3, the compound of formula (M) instead of Compound (1-1) in a light-emitting layer 4 and Compound (1-1) instead of the compound of formula (G) in an electron-transporting layer 5, respectively, an organic EL device was fabricated. When a dc voltage of 10 V was applied to the resulting device, blue light emission of 1000 cd/m$^2$ was obtained.

EXAMPLE 22

In a similar manner to Example 21 except for the use of Compound (1-2) instead of Compound (1-1) in an electron-transporting layer 5, an organic EL device was fabricated. When a dc voltage of 10 V was applied to the resulting device, blue light emission of 1200 cd/m$^2$ was obtained.

EXAMPLE 23

In a similar manner to Example 21 except for the use of Compound (1-3) instead of Compound (1-1) in an electron-transporting layer 3, an organic EL device was fabricated. When a dc voltage of 10 V was applied to the resulting device, blue light emission of 900 cd/m$^2$ was obtained.

EXAMPLE 24

In a similar manner to Example 21 except for the use of Compound (1-4) instead of Compound (1-1) in an electron-transporting layer 5, an organic EL device was fabricated. When a dc voltage of 10 V was applied to the resulting device, blue light emission of 1100 cd/m$^2$ was obtained.

What is claimed is:

1. An organic electroluminescent device comprising an anode, a cathode and one or more than one organic thin-film layer including a light-emitting layer between said anode and said cathode, wherein at least one of said organic thin-film layers contains, either singly or as a mixture, a compound represented by the following formula (1):

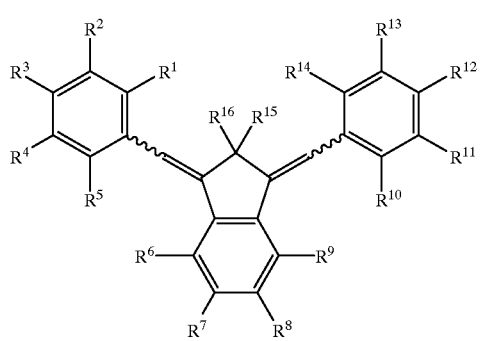

(1)

wherein $R^1$ to $R^{16}$ each independently represents a hydrogen atom, a halogen atom, a nitro group, a cyano group, a substituted or unsubstituted alkyl group, a substituted or unsubstituted alkenyl group, a substituted or unsubstituted aromatic hydrocarbon group, a substituted or unsubstituted aromatic heterocyclic group, a substituted or unsubstituted amino group, a substituted or unsubstituted alkoxy group, a substituted or unsubstituted aryloxy group, a substituted or unsubstituted alkoxycarbonyl group or a carboxyl group; and any two of $R^1$ to $R^{14}$ may form a ring.

2. An organic electroluminescent device as defined in claim 1, wherein said organic thin-film layers comprise only a light-emitting layer.

3. An organic electroluminescent device as defined in claim 1, wherein said organic thin-film layers comprise a light-emitting layer and a hole-transporting layer and said hole-transporting layer contains the compound of formula (1) either singly or as a mixture.

4. An organic electroluminescent device as defined in claim 1, wherein said organic thin-film layers comprise a light-emitting layer and a hole-transporting layer and said light-emitting layer contains the compound of formula (1) either singly or as a mixture.

5. An organic electroluminescent device as defined in claim 1, wherein said organic thin-film layers comprise a light-emitting layer and an electron-transporting layer and said electron-transporting layer contains the compound of formula (1) either singly or as a mixture.

6. An organic electroluminescent device as defined in claim 1, wherein said organic thin-film layers comprise a light-emitting layer and an electron-transporting layer and said light-emitting layer contains the compound of formula (1) either singly or as a mixture.

7. An organic electroluminescent device as defined in claim 1, wherein said organic thin-film layers comprise a hole-transporting layer, a light-emitting layer and an electron-transporting layer and said hole-transporting layer contains the compound of formula (1) either singly or as a mixture.

8. An organic electroluminescent device as defined in claim 1, wherein said organic thin-film layers comprise a hole-transporting layer, a light-emitting layer and an electron-transporting layer and said light-emitting layer contains the compound of formula (1) either singly or as a mixture.

9. An organic electroluminescent device as defined in claim 1, wherein said organic thin-film layers comprise a hole-transporting layer, a light-emitting layer and an electron-transporting layer and said electron-transporting layer contains the compound of formula (1) either singly or as a mixture.

* * * * *